(12) United States Patent  
Khonsari et al.

(10) Patent No.: US 7,826,127 B2  
(45) Date of Patent: Nov. 2, 2010

(54) MEMS DEVICE HAVING A RECESSED CAVITY AND METHODS THEREFOR

(75) Inventors: Nassim Khonsari, Redwood City, CA (US); Clarence Chui, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/765,981

(22) Filed: Jun. 20, 2007

(65) Prior Publication Data

US 2007/0297037 A1    Dec. 27, 2007

Related U.S. Application Data

(60) Provisional application No. 60/815,905, filed on Jun. 21, 2006.

(51) Int. Cl.  
G02B 26/00 (2006.01)  
G02F 1/03 (2006.01)  
H01L 23/20 (2006.01)

(52) U.S. Cl. .................. 359/291; 359/247; 257/682

(58) Field of Classification Search ......... 359/245, 359/247, 250, 254, 259, 337.22, 902, 302, 359/298, 316, 305, 308, 291; 257/678, 682; 438/115, 124; 398/149; 356/28.5, 35.5, 356/450, 460, 477; 342/156, 424; 34/294, 34/299  
See application file for complete search history.

(56) References Cited

U.S. PATENT DOCUMENTS

| | | |
|---|---|---|
| 3,704,806 A | 12/1972 | Plachenov et al. |
| 3,900,440 A | 8/1975 | Ohara et al. |
| 4,036,360 A | 7/1977 | Deffeyes |
| 4,074,480 A | 2/1978 | Burton |
| 4,431,691 A | 2/1984 | Greenlee |
| 4,531,126 A | 7/1985 | Sadones |
| 4,552,806 A | 11/1985 | Hayashi et al. |

(Continued)

FOREIGN PATENT DOCUMENTS

EP    1 093 162    4/2001

(Continued)

OTHER PUBLICATIONS

Jung et al., Soldered sealing process to assemble a protective cap for a MEMS CSP, Design, Test, Integration and Packaging of MEMS/MOEMS 2003 Symposium, pp. 255-260.

(Continued)

*Primary Examiner*—Scott J Sugarman  
*Assistant Examiner*—Dawayne A Pinkney  
(74) *Attorney, Agent, or Firm*—Knobbe Martens Olson & Bear LLP

(57) ABSTRACT

A microelectromechanical systems device having a transparent substrate joined to a planar backplate with a raised perimeter structure forming a recessed cavity or cell. The raised perimeter structure is formed by applying a first layer around the peripheral area of the backplate to form a recessed cell. A second layer is applied over the first layer. The first layer is thicker than the second layer. The thicker layer comprises a viscous material. A second layer is a thinner adhesive layer, and is applied over the thicker layer to join the backplate to the transparent substrate to encapsulate the microelectromechanical systems device formed on the transparent substrate.

23 Claims, 11 Drawing Sheets

U.S. PATENT DOCUMENTS

| | | | |
|---|---|---|---|
| 4,950,344 A | 8/1990 | Glover et al. |
| 4,954,789 A | 9/1990 | Sampsell |
| 4,977,009 A | 12/1990 | Anderson et al. |
| 5,018,256 A | 5/1991 | Hornbeck |
| 5,075,796 A | 12/1991 | Schildkraut et al. |
| 5,091,983 A | 2/1992 | Lukosz |
| 5,095,375 A | 3/1992 | Bolt |
| 5,099,353 A | 3/1992 | Hornbeck |
| 5,172,262 A | 12/1992 | Hornbeck |
| 5,212,582 A | 5/1993 | Nelson |
| 5,216,537 A | 6/1993 | Hornbeck |
| 5,244,707 A | 9/1993 | Shores |
| 5,293,511 A | 3/1994 | Poradish et al. |
| 5,304,419 A | 4/1994 | Shores |
| 5,381,253 A | 1/1995 | Sharp et al. |
| 5,547,823 A | 8/1996 | Murasawa et al. |
| 5,550,373 A | 8/1996 | Cole et al. |
| 5,553,440 A | 9/1996 | Bulger et al. |
| 5,559,358 A | 9/1996 | Burns et al. |
| 5,591,379 A | 1/1997 | Shores |
| 5,646,729 A | 7/1997 | Koskinen et al. |
| 5,703,710 A | 12/1997 | Brinkman et al. |
| 5,739,945 A | 4/1998 | Tayebati |
| 5,815,141 A | 9/1998 | Phares |
| 5,835,255 A | 11/1998 | Miles |
| 5,853,662 A | 12/1998 | Watanabe |
| 5,939,785 A | 8/1999 | Klonis et al. |
| 5,986,796 A | 11/1999 | Miles |
| 6,040,937 A | 3/2000 | Miles |
| 6,055,090 A | 4/2000 | Miles |
| 6,238,755 B1 | 5/2001 | Harvey et al. |
| 6,355,328 B1 | 3/2002 | Baratuci et al. |
| 6,455,927 B1 | 9/2002 | Glenn et al. |
| 6,467,139 B1 | 10/2002 | Tanaka |
| 6,489,670 B1 | 12/2002 | Peterson et al. |
| 6,495,895 B1 | 12/2002 | Peterson et al. |
| 6,538,312 B1 | 3/2003 | Peterson et al. |
| 6,582,789 B1 | 6/2003 | Sumi |
| 6,589,625 B1 | 7/2003 | Kothari et al. |
| 6,603,182 B1 | 8/2003 | Low et al. |
| 6,621,134 B1 | 9/2003 | Zurn |
| 6,650,455 B2 | 11/2003 | Miles |
| 6,661,084 B1 | 12/2003 | Peterson et al. |
| 6,674,159 B1 | 1/2004 | Peterson et al. |
| 6,674,562 B1 | 1/2004 | Miles |
| 6,680,792 B2 | 1/2004 | Miles |
| 6,709,750 B1 | 3/2004 | Pohlmann et al. |
| 6,743,656 B2 | 6/2004 | Orcutt et al. |
| 6,791,660 B1 | 9/2004 | Hayashi et al. |
| 6,838,309 B1 | 1/2005 | McCann |
| 6,867,896 B2 | 3/2005 | Miles |
| 6,872,984 B1 | 3/2005 | Leung |
| 6,999,225 B2 | 2/2006 | Lin et al. |
| 7,012,726 B1 | 3/2006 | Miles |
| 7,012,732 B2 | 3/2006 | Miles |
| 7,015,885 B2 | 3/2006 | Novotny et al. |
| 7,034,984 B2 | 4/2006 | Pan et al. |
| 7,042,643 B2 | 5/2006 | Miles |
| 7,119,945 B2 | 10/2006 | Kothari et al. |
| 7,123,216 B1 | 10/2006 | Miles |
| 7,126,741 B2 | 10/2006 | Wagner et al. |
| 7,130,104 B2 | 10/2006 | Cummings |
| 7,136,213 B2 | 11/2006 | Chui |
| 7,138,984 B1 | 11/2006 | Miles |
| 7,142,346 B2 | 11/2006 | Chui et al. |
| 7,164,520 B2 | 1/2007 | Palmateer et al. |
| 7,259,449 B2 * | 8/2007 | Floyd .................. 257/678 |
| 7,317,281 B2 | 1/2008 | Hayashi et al. |
| RE40,436 E | 7/2008 | Kothari et al. |
| 7,471,444 B2 * | 12/2008 | Miles .................. 359/291 |
| 7,518,775 B2 | 4/2009 | Miles et al. |
| 2002/0000649 A1 | 1/2002 | Tilmans et al. |
| 2002/0056900 A1 | 5/2002 | Liu et al. |
| 2002/0075551 A1 | 6/2002 | Daneman |
| 2002/0075555 A1 | 6/2002 | Miles |
| 2002/0121909 A1 | 9/2002 | Sato et al. |
| 2002/0126364 A1 | 9/2002 | Miles |
| 2002/0160583 A1 | 10/2002 | Song |
| 2002/0187254 A1 | 12/2002 | Ghosh |
| 2003/0053233 A1 | 3/2003 | Felton |
| 2003/0054588 A1 | 3/2003 | Patel et al. |
| 2003/0062186 A1 | 4/2003 | Boroson et al. |
| 2003/0075794 A1 | 4/2003 | Felton et al. |
| 2003/0103185 A1 | 6/2003 | Kim et al. |
| 2003/0104651 A1 | 6/2003 | Kim et al. |
| 2003/0108306 A1 | 6/2003 | Whitney et al. |
| 2003/0143423 A1 | 7/2003 | McCormick et al. |
| 2003/0155643 A1 | 8/2003 | Freidhoff |
| 2003/0183916 A1 | 10/2003 | Heck et al. |
| 2003/0184412 A1 | 10/2003 | Gorrell |
| 2003/0214007 A1 | 11/2003 | Tao et al. |
| 2004/0048037 A1 | 3/2004 | Klausmann et al. |
| 2004/0061492 A1 | 4/2004 | Lopes et al. |
| 2004/0066258 A1 | 4/2004 | Cohn et al. |
| 2004/0070706 A1 | 4/2004 | Freeman |
| 2004/0100677 A1 | 5/2004 | Huibers et al. |
| 2004/0140557 A1 | 7/2004 | Sun et al. |
| 2004/0184133 A1 | 9/2004 | Su et al. |
| 2005/0023976 A1 | 2/2005 | Wang |
| 2005/0035699 A1 | 2/2005 | Tsai |
| 2005/0036192 A1 | 2/2005 | Lin et al. |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0074919 A1 | 4/2005 | Patel et al. |
| 2005/0093134 A1 | 5/2005 | Tarn |
| 2005/0167795 A1 | 8/2005 | Higashi |
| 2005/0174048 A1 | 8/2005 | Matsukaze |
| 2005/0253283 A1 | 11/2005 | DCamp et al. |
| 2006/0066935 A1 | 3/2006 | Cummings et al. |
| 2006/0076631 A1 | 4/2006 | Palmateer et al. |
| 2006/0076634 A1 | 4/2006 | Palmateer et al. |
| 2006/0076637 A1 | 4/2006 | Gally |
| 2006/0077126 A1 | 4/2006 | Kothari |
| 2006/0077145 A1 | 4/2006 | Floyd |
| 2006/0077503 A1 | 4/2006 | Palmateer et al. |
| 2006/0079098 A1 | 4/2006 | Floyd |
| 2006/0152106 A1 | 7/2006 | Yan et al. |
| 2006/0197215 A1 | 9/2006 | Potter |
| 2006/0214247 A1 | 9/2006 | Dcamp et al. |
| 2007/0064295 A1 | 3/2007 | Faase et al. |
| 2007/0097477 A1 | 5/2007 | Miles |
| 2007/0139655 A1 | 6/2007 | Luo |
| 2007/0242345 A1 | 10/2007 | Natarajan et al. |
| 2007/0298541 A1 | 12/2007 | Floyd |
| 2008/0038876 A1 | 2/2008 | Floyd |
| 2008/0112036 A1 | 5/2008 | Cummings |
| 2009/0189230 A1 | 7/2009 | Palmateer et al. |

FOREIGN PATENT DOCUMENTS

| | | |
|---|---|---|
| EP | 1418154 A2 | 5/2004 |
| EP | 1 640 326 | 3/2006 |
| FR | 2842380 | 12/2003 |
| JP | 59-6842 | 1/1984 |
| JP | 04-085859 | 3/1992 |
| JP | 11-145337 | 5/1999 |
| WO | WO 01/45140 | 6/2001 |
| WO | WO 02/42716 A2 | 5/2002 |
| WO | WO 03/007049 A1 | 1/2003 |
| WO | WO 03/009318 | 1/2003 |
| WO | WO 03/026369 A1 | 3/2003 |
| WO | WO 03/105198 | 12/2003 |
| WO | WO 2004/025727 | 3/2004 |

| WO | WO 2005/110914 A1 | 11/2005 |
| WO | WO 2005/114294 A1 | 12/2005 |

OTHER PUBLICATIONS

Kim et al., Fabrication and characterization of a low-temperature hermetic MEMS package bonded by a closed loop AuSn solder-line, Proceedings of the IEEE 16th Annual International Conference on Micro Electro Mechanical Systems, Jan. 2003, pp. 614-617.

Maharbiz et al., Batch micropackaging by compression-bonded wafer-wafer transfer, Twelfth IEEE International Conference on Micro Electro Mechanical Systems, Jan. 17-21, 1999, pp. 482-489.

Tao et al., Selective Bonding and encapsulation for wafer-level vacuum packaging of mems and related micro systems, Microelectronics and Reliability, 44(2):251-258, Feb. 2004.

Tilmans et al., The indent reflow sealing (IRS) technique-A method for the fabrication of sealed cavities for mems devices, Journal of Microelectromechanical Systems, 9(2), Jun. 2000.

Tominetti, et al., Moisture and impurities detection and removal in packaged MEMS, Proceedings of the SPIE, Reliability, Testing and Characterization of MEMS/MOEMS, Oct. 2001, pp. 215-225.

Yang et al., Localized induction heating solder bonding for wafer level MEMS packaging, 17th IEEE International Conference on Micro Electro Mechanical Systems, Jan. 2004, pp. 729-732.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

The International Search Report and the Written Opinion from International Application No. PCT/US2007/014359, dated Apr. 9, 2008.

IPRP for PCT/US07/014359 filed Jun. 19, 2007.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

MEMS DEVICE HAVING A RECESSED CAVITY AND METHODS THEREFOR

CROSS-REFERENCE TO RELATED APPLICATION

This application claims the benefit of U.S. Provisional Application No. 60/815,905, filed Jun. 21, 2006. This application is also related to U.S. patent application Ser. No. 11/735,362, filed Apr. 13, 2007.

BACKGROUND

1. Field

The field of the invention relates to microelectromechanical systems (MEMS) and the packaging of such systems. More specifically, the field of the invention relates to interferometric modulators having a recessed cavity and methods of fabricating such modulators.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices described herein each have several aspects, no single one of which is solely responsible for its desirable attributes. After considering this discussion, and particularly after reading the section entitled "Detailed Description of Certain Embodiments" one will understand how the features of described herein provide advantages over other display devices.

In accordance with an embodiment, a microelectromechanical systems device is provided. The device includes a transparent substrate, a substantially planar backplate upon which a material is applied to form a raised perimeter area, and a seal. The transparent substrate has a microelectromechanical systems device formed thereon. The seal joins the raised perimeter area of the backplate to the transparent substrate.

In accordance with another embodiment, a method is provided for manufacturing a display device. A transparent substrate having a microelectromechanical systems device formed thereon is provided. A substantially planar backplate with a first layer comprising a material applied around an outer perimeter area of the backplate is provided. An adhesive second layer is applied over the first layer. The backplate is joined to the transparent substrate by contacting the second layer to the transparent substrate to form a package after applying the adhesive second layer, and the microelectromechanical systems device is encapsulated by the package.

According to yet another embodiment, a microelectromechanical systems based device is provided. The device includes a transmitting means for transmitting light therethrough, a substantially planar backplate, and a sealing means for sealing the modulating means within a package between the transmitting means and the backplate. The transmitting means has a modulating means formed thereon. The backplate has a raised perimeter area joined to the transparent substrate. The raised perimeter area comprises a material applied to the backplate.

BRIEF DESCRIPTION OF THE DRAWINGS

These and other aspects will be readily apparent from the following description and from the appended drawings (not to scale), which are meant to illustrate and not to limit the embodiments described herein, and wherein.

DETAILED DESCRIPTION

The following detailed description is directed to certain specific embodiments. However, the devices and methods described herein can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One embodiment is a MEMS device that includes a planar backplate and a recessed cavity. In one embodiment, the device is an interferometric modulator type display, and includes an array of interferometric modulators fabricated on the surface of a first substrate. The first substrate is sealed to a second substrate, typically a planar backplate having a raised perimeter, forming a recessed cavity. In one embodiment, a first layer is applied to the perimeter area of the backplate to form the raised perimeter. A second layer is applied over the first layer. The first layer may be more viscous and thicker than the second layer. In one embodiment, the first layer comprises epoxy and includes glass spacers that make the first epoxy layer more impermeable to water. In one embodiment, the first layer is screen printed around the perimeter area of the backplate. The first layer is then cured, for example, by application of heat. In an embodiment, the second layer is then screen printed over the first layer and the first substrate is pressed against the second layer. The second layer is then cured.

Figure 1:
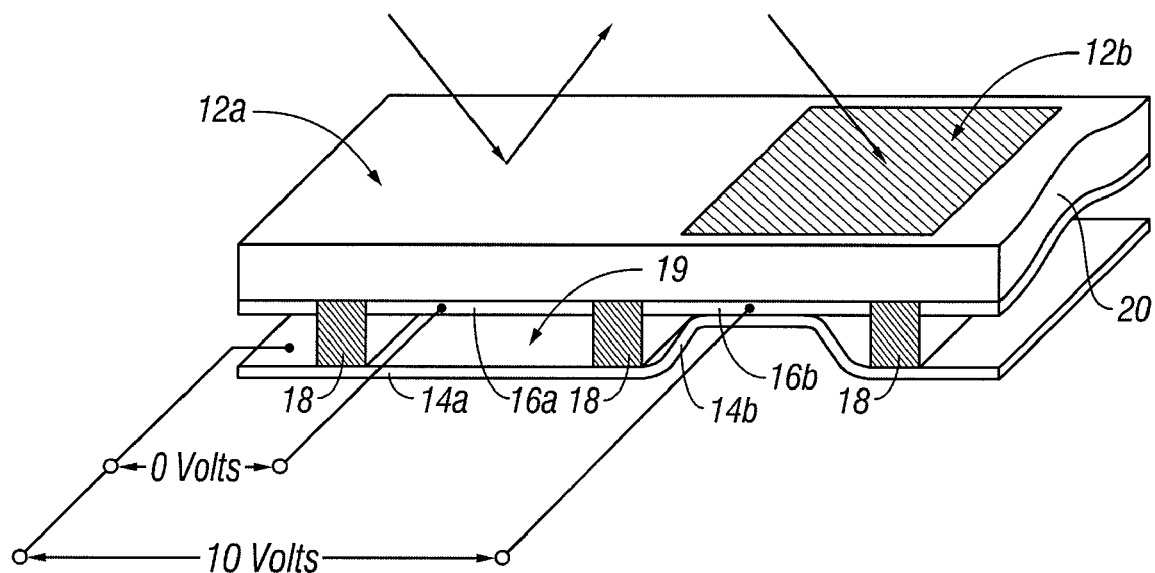
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers or mirrors may be moved between two positions. In the first position, referred to herein as the relaxed, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a, 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the reflective layers 14, and these strips may form column electrodes in a display device.

With no applied voltage, the gap 19 remains between the movable reflective layers 14a and the optical stack 16a, with the movable reflective layer 14a in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
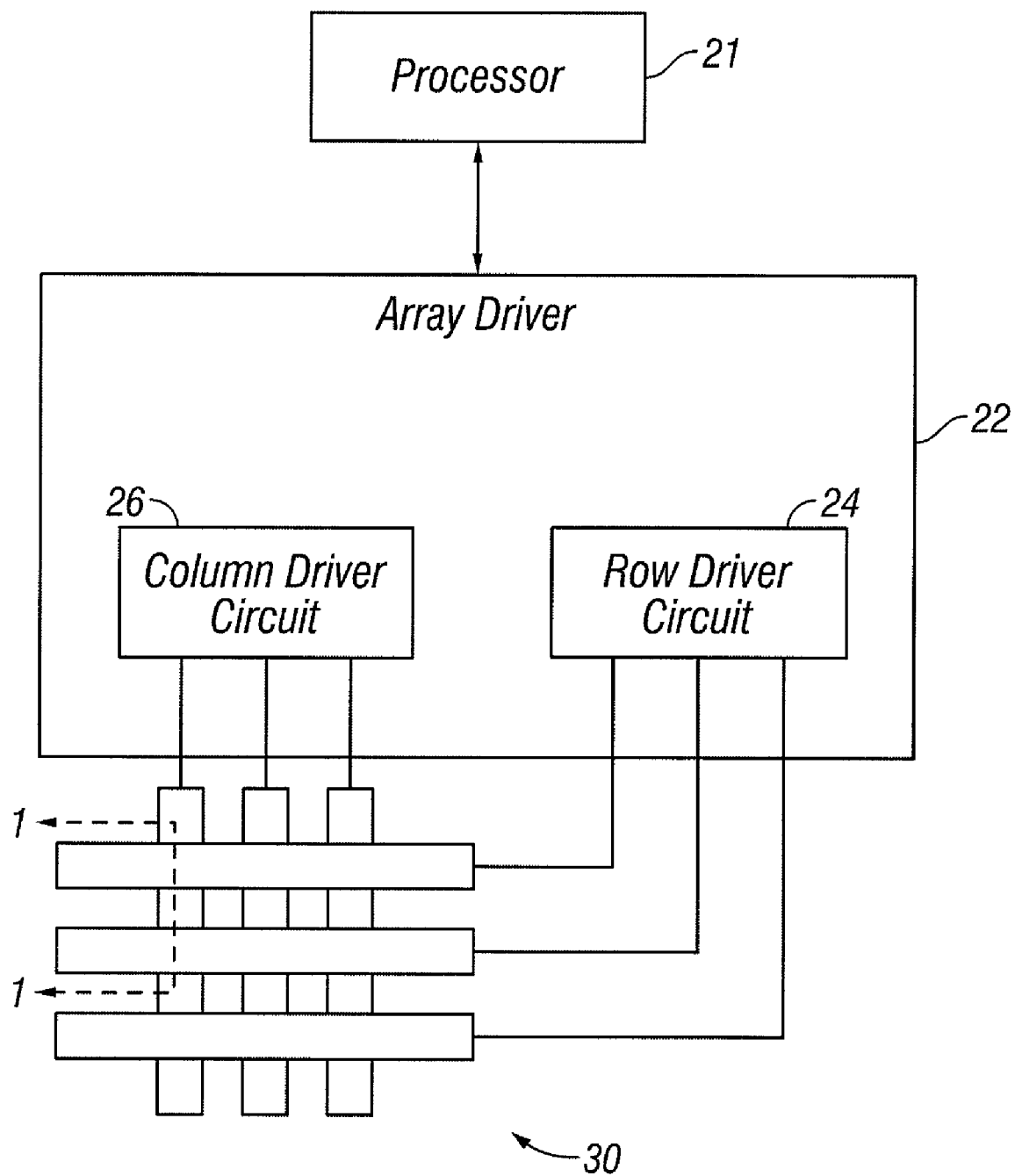
FIG. 2 is a system block diagram illustrating one embodiment of an electronic device incorporating a 3×3 interferometric modulator display.

FIG. 2 is a system block diagram illustrating one embodiment of an electronic device. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
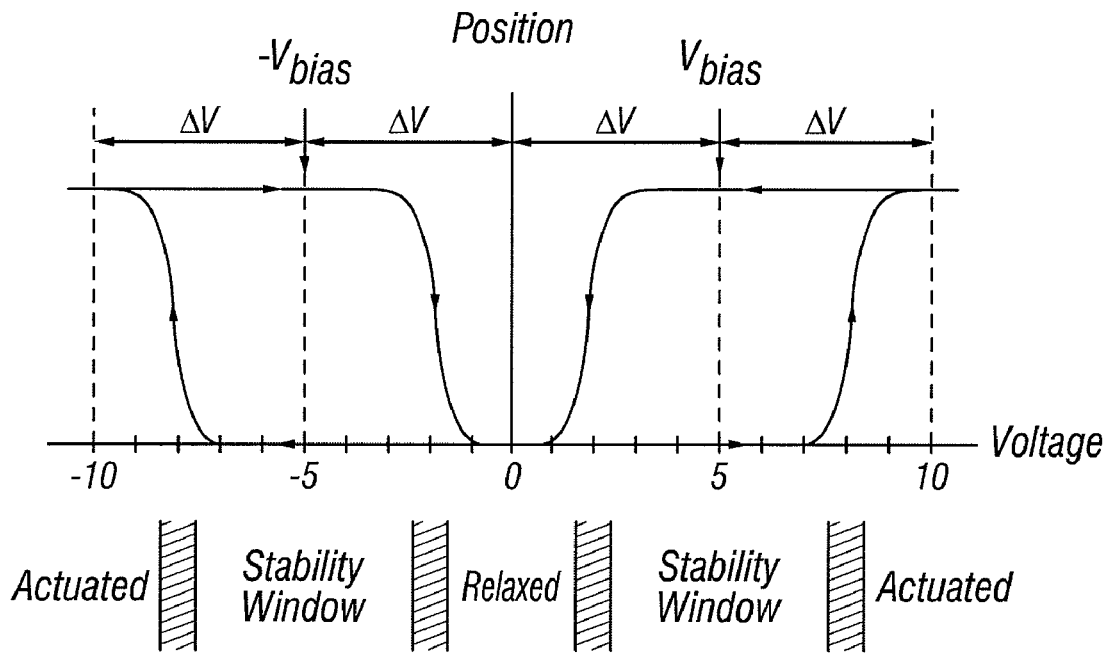
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
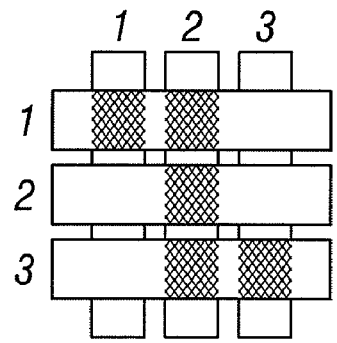
FIGS. 5A and 5B illustrate one exemplary timing diagram for row and column signals that may be used to write a frame of display data to the 3×3 interferometric modulator display of FIG. 2.
Figure 5B:
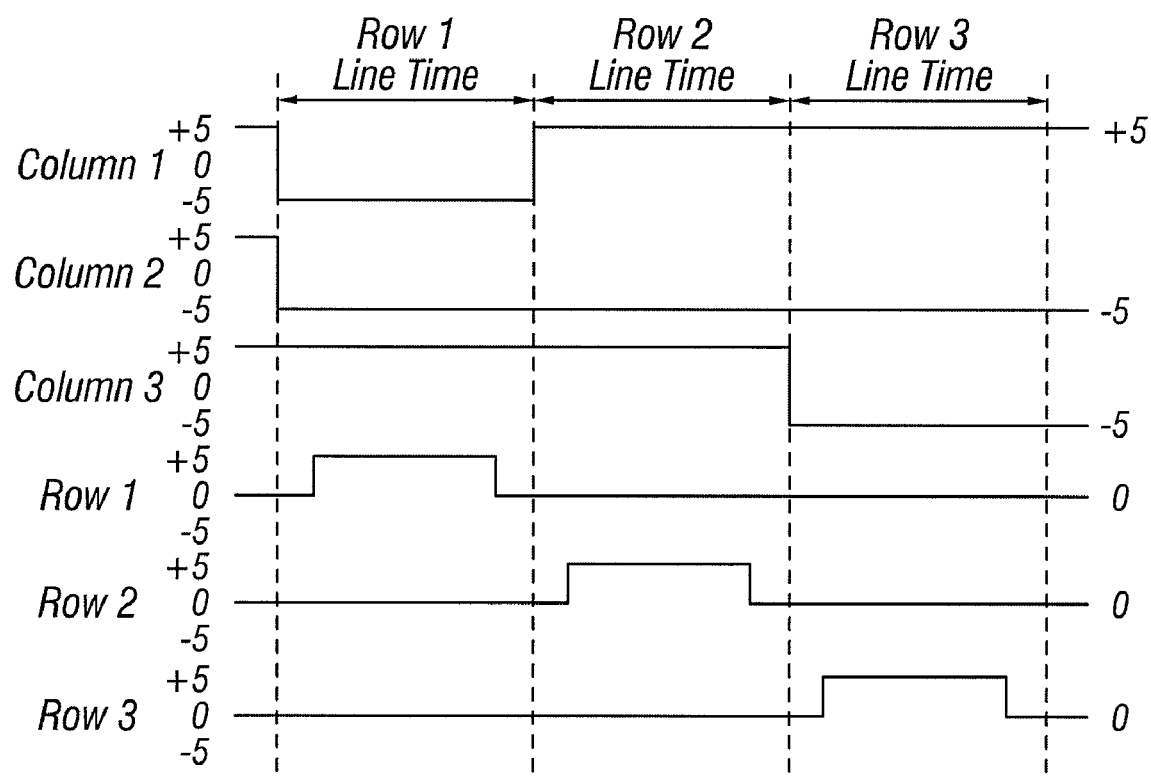

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
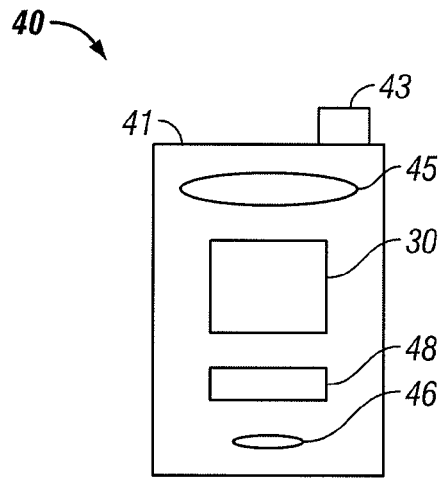
FIGS. 6A and 6B are system block diagrams illustrating an embodiment of a visual display device comprising a plurality of interferometric modulators.
Figure 6B:
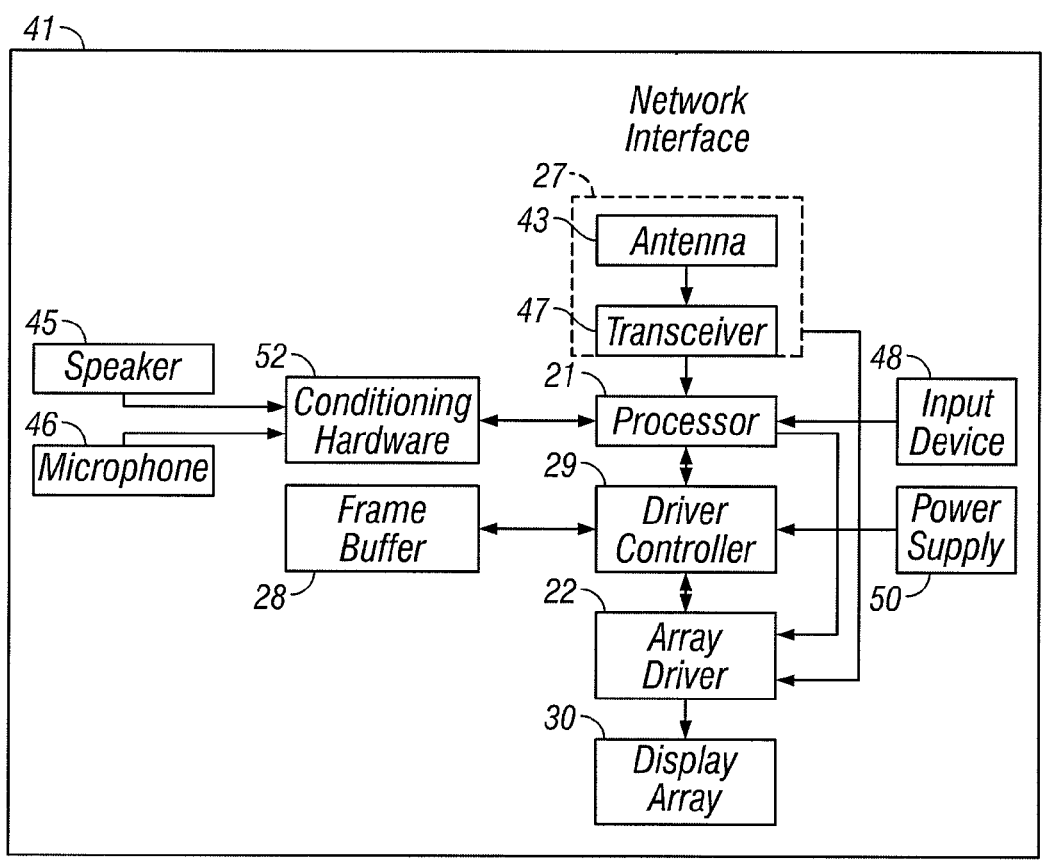

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 44 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 44, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems, such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some embodiments, control programmability resides in the array driver 22. Those of skill in the art will recognize that the above-described optimization may be implemented in any number of hardware and/or software components and in various configurations.

Figure 7A:
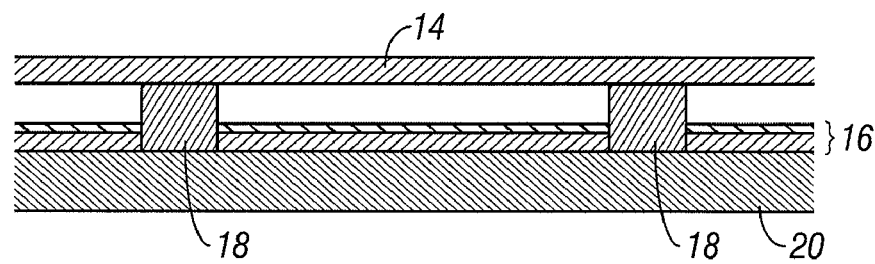
FIG. 7A is a cross section of the device of FIG. 1.
Figure 7B:
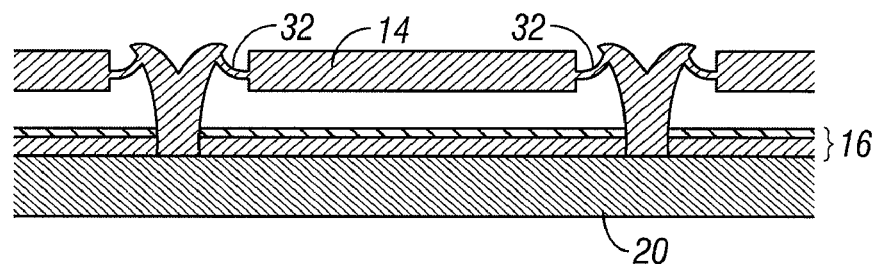
FIG. 7B is a cross section of an alternative embodiment of an interferometric modulator.
Figure 7C:
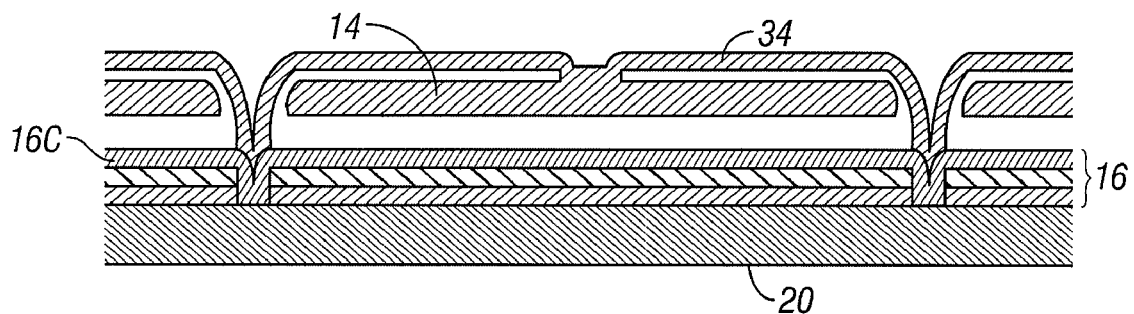
FIG. 7C is a cross section of another alternative embodiment of an interferometric modulator.
Figure 7D:
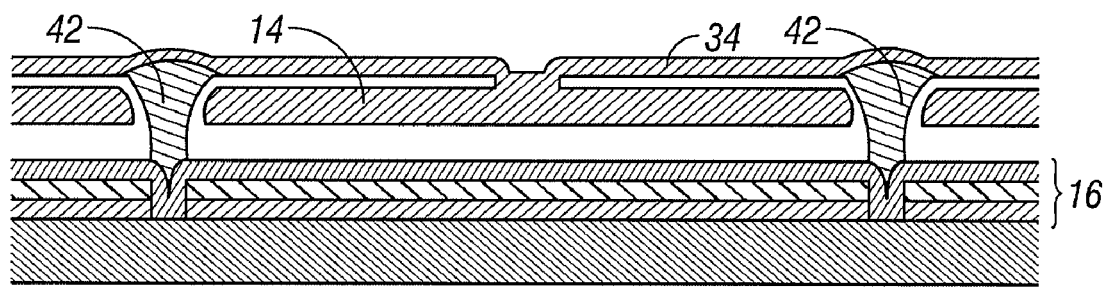
FIG. 7D is a cross section of yet another alternative embodiment of an interferometric modulator.
Figure 7E:
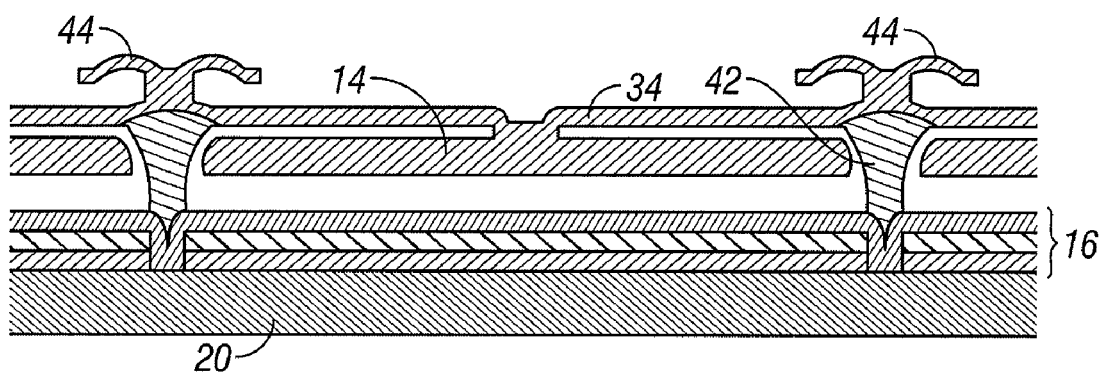
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective material 14 is suspended from a deformable layer 34, which may comprise a flexible metal. The deformable layer 34 connects, directly or indirectly, to the substrate 20 around the perimeter of the deformable layer 34. The embodiment illustrated in FIG. 7D has support post plugs 42 upon which the deformable layer 34 rests. The moveable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
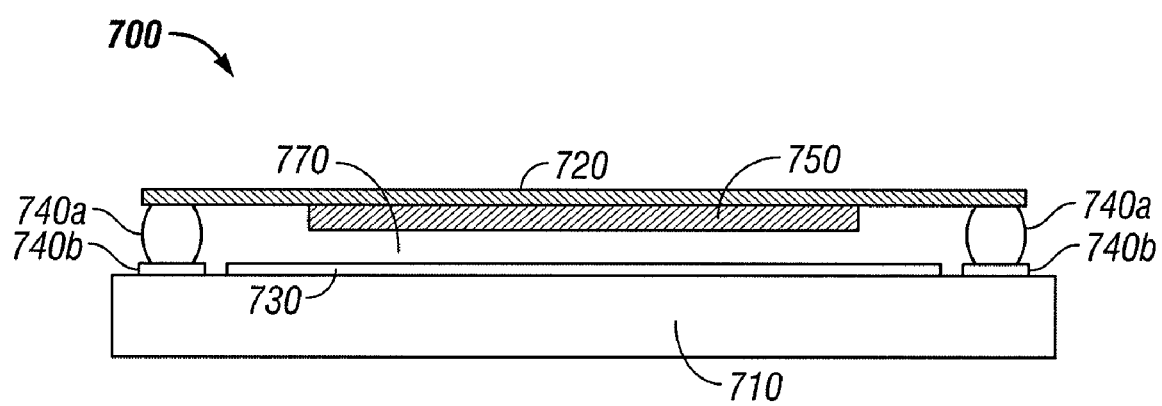
FIG. 8 is a cross-section of an embodiment of a package structure encapsulating an interferometric modulator device and having a planar backplate with a raised perimeter.

Packaging techniques for microelectromechanical systems devices, including interferometric modulators, will be described in more detail below. It will be understood that the term "microelectromechanical systems device," as used herein, also includes nanoelectromechanical devices and is not limited to devices having structures having dimensions in the range of one micrometer to one millimeter. A schematic cross-section of one embodiment 700 of an interferometric modulator is illustrated in FIG. 8. As shown in FIG. 8, a package structure 700 includes a transparent substrate 710 and a backplate cover or "cap" 720. An interferometric modulator array 730 is encapsulated within the package structure 700. In the illustrated embodiment, the planar backplate 720 is preferably formed with a raised perimeter structure 740a in the outer peripheral area of the backplate 720. This raised perimeter 740a forms a recessed cavity or cell on the planar backplate 720. Preferably, the backplate 720 and transparent substrate 710 are sealed together with a seal 740b, which is applied over the raised perimeter 740a, to encapsulate and protect the interferometric modulator array or modulating means 730 from harmful elements in the environment, such as moisture and other contaminants.

A method of packaging an interferometric modulator according to the embodiment shown in FIGS. 8 and 9 will be discussed in more detail below. The packages and packaging methods described herein may be used for packaging any interferometric modulator, including, but not limited to, the interferometric modulators described above.

As discussed above, the interferometric modulator or modulating 730 is configured to reflect or modulate light through the transparent substrate 710 and includes moving parts. A gap or cavity 770 is preferably created between the interferometric modulator 730 and the backplate 720. It will be understood that this gap or cavity 770 between the interferometric modulator 730 and the backplate 720 is different from the optical cavity 19 within the interferometric modulator array 730. According to an embodiment, the gap or cavity 770 is created when the backplate 720, with the raised perimeter 740a formed thereon, is joined to the transparent substrate 710, as shown in FIG. 8.

The transparent substrate or transmitting means 710 may be any transparent substance capable of having thin film, MEMS devices built upon it. The transparent substrate 710 is configured to transmit light therethrough. Such transparent substances include, but are not limited to, glass, plastic, and transparent polymers. Images are displayed through the transparent substrate 710, which serves as an imaging surface.

In accordance with an embodiment, the interferometric modulator 730 is preferably formed on the transparent substrate 710. It will be understood that the optical stacks 16a, 16b of the interferometric modulator 730 are adjacent the transparent substrate 710 and the movable reflective layers 14a, 14b are formed over the optical stacks 16a, 16b.

To form the interferometric modulator 730, the transparent substrate 710, in one embodiment, is covered with indium tin oxide (ITO). The ITO may be deposited by standard deposition techniques, including chemical vapor deposition (CVD) and sputtering, preferably to a thickness of about 500 Å. A relatively thin layer of a partially reflective material, such as chrome, is preferably deposited over the ITO. A layer of silicon dioxide ($SiO_2$) is preferably formed over the ITO/chrome bilayer, and then etched and patterned into rows to form the optical stacks or row electrodes 16a, 16b. A sacrificial layer, preferably formed of silicon (Si) is deposited (and subsequently removed) over the structure to create a resonant optical cavity or gap 19. In other embodiments, this sacrificial layer may be formed of other materials, such as, for example, molybdenum (Mo), tungsten (W), or titanium (Ti). The skilled artisan will understand that the sacrificial layer is formed of a material that is selectively etchable relative to the upper layers of the optical stacks 16a, 16b and other adjacent materials of the device (e.g., movable reflective layers, which are deposited over the sacrificial layer, as described below).

Another reflective layer, preferably formed of aluminum, is deposited over the sacrificial layer to form the movable reflective layers 14a, 14b of the interferometric modulator 730. This movable layer 14 is deposited and patterned into rows orthogonal to the row electrodes 16a, 16b to create the row/column array described above. In other embodiments, this layer 14 may comprise highly reflective metals, such as, for example, silver (Ag) or gold (Au). Alternatively, this reflective layer 14 may be a stack of metals configured to give the proper optical and mechanical properties.

The sacrificial layer is subsequently removed, preferably using a gas etching process, after the movable layers 14a, 14b are formed to create the optical cavity or gap 19 between the optical stacks 16a, 16b and the movable layers 14a, 14b. The optical cavity or gap 19 allows the movable layers 14a, 14b to move. In an embodiment, this sacrificial layer is removed after the backplate 720 is joined to the transparent substrate 710 through an opening (which is later sealed) in either the backplate 720 or raised perimeter 740a. Standard etching techniques may be used to remove the sacrificial layer. The particular release etching technique will depend on the material to be released. For example, a fluorine-based etchant (e.g., xenon difluoride ($XeF_2$)) may be used to remove a silicon sacrificial layer. In another embodiment, the sacrificial layer between the optical stacks 16a, 16b and the movable layers 14a, 14b is removed before the backplate 720 is joined to the transparent substrate 710. The skilled artisan will appreciate that each layer of the interferometric modulator 730 is preferably deposited and patterned using standard deposition techniques and standard photolithographic techniques.

The skilled artisan will understand that the backplate 720 serves a mechanical function, protecting the interferometric modulator 730 from contaminants in the environment. The backplate 720, along with the transparent substrate 710, raised perimeter 740a, and a perimeter seal or sealing means 740b (which is described in more detail below) prevent mechanical interference, moisture, and contaminant gases from reaching and potentially damaging the interferometric modulator 730 within the package structure 700. The backplate 720 may therefore be formed of any suitable material, whether transparent or opaque, conductive or insulating, that is capable of preventing contaminants in the environment from reaching the interferometric modulator 730 encapsulated within the package 700. Suitable materials for the backplate 720 include, but are not limited to, glass (e.g., float, 1737, soda lime), plastic, ceramics, polymers, laminates, and metals and metal foils (e.g., stainless steel (SS302, SS410), Kovar, plated Kovar).

According to an embodiment, a sealing means or seal 740b is provided over the raised perimeter 740a to join the transparent substrate 710 and the backplate 720, surrounding the interferometric modulator 730 to form the package structure 700. It will be understood that the raised perimeter 740a provides a recessed area or cell 780 (FIG. 10), and allows both the transparent substrate 710 and the backplate 720 to be planar, as illustrated in FIG. 8. The raised perimeter 740a thus eliminates the need for a recessed backplate or the use of frit bonded glass for the backplate although the skilled artisan will appreciate that the raised perimeter 740a can be applied to a recessed backplate or frit bonded glass.

Figure 9A:
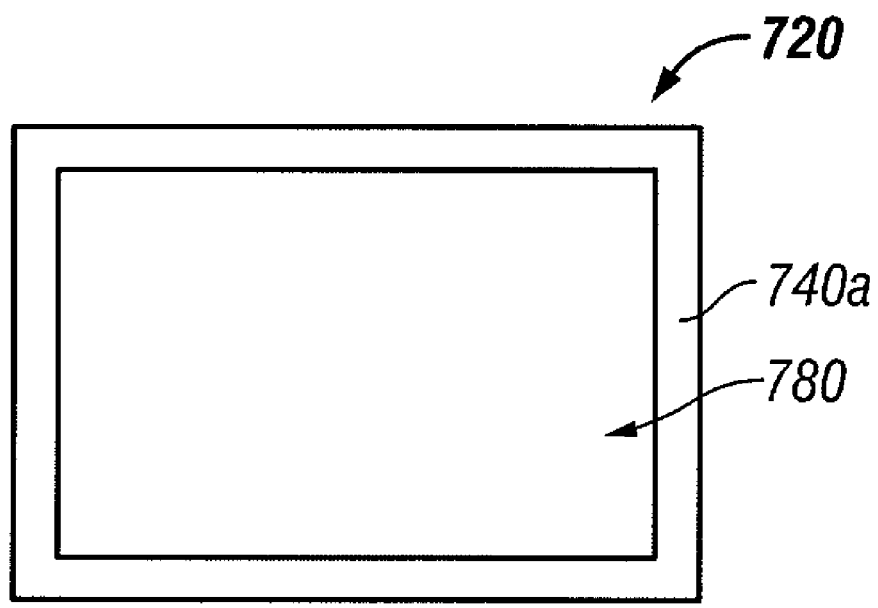
FIGS. 9A-B are bottom plan views of embodiments of a backplate with a raised perimeter and recessed cavity.
Figure 9B:
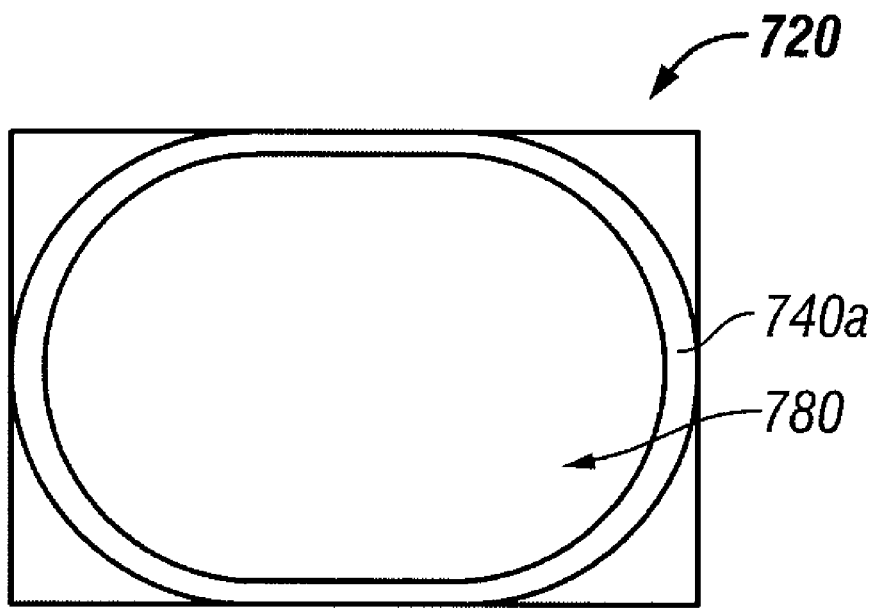

FIG. 9A is a bottom plan view of the backplate 720. As shown in FIG. 9A, the raised perimeter 740a extends around the entire peripheral area of the backplate 720. Although the raised perimeter 740a has a rectangular shape in the illustrated embodiment, the skilled artisan will appreciate that it may be formed in other shapes (e.g., circle, oval, etc.) so long as it surrounds the interferometric modulator array(s) 730 formed on the transparent substrate 710 after the package structure 700 is formed. FIG. 9B shows another embodiment having a raised perimeter 740a in the shape of an oval.

According to an embodiment, the raised perimeter 740a comprises a first, thicker layer of an organic or organic composite material that is applied around the outer peripheral area of the backplate 720. The seal 740b comprises a second, thinner adhesive layer over the raised perimeter structure 740a. In an embodiment, the raised perimeter 740a comprises a high-viscosity, organic epoxy-based adhesive material. Other suitable materials for the raised perimeter 740a include, but are not limited to, glass binders, such as polyurethane, polysulfide, silicone, vinyl acetate, cellulose vinyl, and neoprene, as well as other materials containing any of the aforementioned binding materials (including, for example, desiccants). The skilled artisan will appreciate that the viscosity of the material allows for the raised perimeter structure 740a to be formed to the desired thickness in order to create the desired height of the recessed cavity.

The raised perimeter 740a is preferably applied to the backplate 720 along the outer peripheral area, to a thickness in the range of about 18-1000 microns, and more preferably in the range of about 38-60 microns. In an embodiment in which the package structure 700 does not include a desiccant, this thickness of the raised perimeter may be about 20 microns in order to create a recessed area, which later forms the gap or cavity 770 between the interferometric modulator array 730 and the backplate 720 after the backplate 720 is sealed to the transparent substrate 710 to encapsulate the package structure 700. The skilled artisan will appreciate that the thickness of the raised perimeter 740a will depend on various factors, including the estimated lifetime of the device, the material of the raised perimeter 740a, the amount of contaminants and moisture that are estimated to permeate into the package structure 700 during the lifetime of the device, the estimated humidity of the ambient environment, and the desiccant, if any, within the device 700. The skilled artisan will understand that the thickness of the raised perimeter 740a is not limited to the ranges provided above and can vary, depending on various factors discussed above.

As shown in FIG. 8, the distance between the interferometric modulator 730 and the backplate 720, or height of the gap 770, depends on the thickness of the raised perimeter 740a and the seal 740b. The creation of the gap or cavity 770 also provides a space for a desiccant, as will be described in more detail below. The skilled artisan will appreciate that the raised perimeter 740a may be formed of a semi-hermetic or fully hermetic material to prevent contaminants from entering the package structure 700. The skilled artisan will understand that, in an embodiment in which the package structure 700 contains more than one interferometric modulator 730, the raised perimeter 740a is typically applied to the backplate 720 around the outer peripheral area such that it surrounds the plurality of interferometric modulators 730 when the backplate 720 is sealed to the transparent substrate 710.

The skilled artisan will readily appreciate that a variety of processes may be used to apply the raised perimeter 740a to the backplate 720. For example, the raised perimeter 740a may be dispensed onto the outer peripheral area of the backplate 720 to the desired thickness. Alternatively, a screen printing process may be used to apply the raised perimeter 740a to the backplate 720. The skilled artisan will appreciate that other techniques, such as using a doctor blade, may be used to apply the raised perimeter 740a to the backplate 720. It will be understood that the raised perimeter 740a may be applied to the backplate 720 under ambient conditions, at a temperature preferably in a range from about room temperature to about 400° C.

Figure 10A:
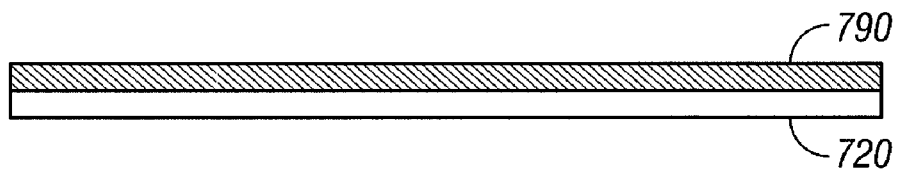
FIGS. 10A-B illustrate an embodiment of a process for forming a raised perimeter a backplate.
Figure 10B:
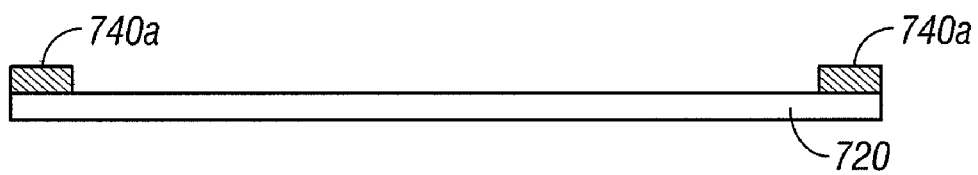

According to another embodiment, the raised perimeter 740a comprises a photosensitive material. A suitable photosensitive material may be an organic composite photosensitive material with inorganic particulates dispersed therein. The skilled artisan will appreciate that the inorganic particulates in the material are provided for seal integrity. It will be understood that other types of photosensitive materials that are hermetic or semi-hermetic may be used. For a raised perimeter 740a comprising a photosensitive material, a layer of the photosensitive material 790 can be deposited over the backplate 720, as shown in FIG. 10A. The layer of the photosensitive material 790 can be deposited by, for example, roller coating or spin coating. Other deposition techniques may also be used to deposit a layer of the photosensitive material 790 over the backplate 720. After depositing the layer 790, standard masking and photolithographic techniques can be used to pattern the photosensitive material 790 to form to the raised perimeter 740a, as shown in FIG. 10B.

After the raised perimeter 740a is applied to the backplate 720, it may be cured and hardened, for example, by application of heat. The skilled artisan will readily appreciate that it can be advantageous to cure the raised perimeter 740a before it is near the interferometric modulator 730 because outgassing from the raised perimeter 740a due to curing could potentially damage the interferometric modulator 730. Thus, according to this embodiment, the raised perimeter 740a on the backplate 720 is cured before it is bonded to the transparent substrate 710 on which the interferometric modulator 730 is formed. The skilled artisan will appreciate that the raised perimeter 740a may be applied to the backplate 720 (and subsequently cured) at any time prior to sealing the backplate 720 to the transparent substrate 710 using the seal 740b (as described below). Thus, the backplate 720 with the raised perimeter 740a may be prepared well in advance of the packaging process if so desired. However, it should be noted that embodiments of the invention are not limited to applying the raised perimeter 740a to the backplate 720. It will be appreciated that the raised perimeter may also be applied to the transparent substrate in other embodiments.

After the raised perimeter 740a is cured, the second, thinner adhesive layer or seal 740b is then applied over the raised perimeter 740a. The backplate 720 is then positioned over the transparent substrate 710 such that the raised perimeter 740a and seal 740b are positioned around the interferometric modulator 730. The backplate 720 and transparent substrate 710 are preferably pressed together such that the seal 740b bonds the transparent substrate 710 to the backplate 720 (with the raised perimeter 740a formed thereon) to encapsulate the interferometric modulator 730 within the package structure 700.

The seal 740b preferably comprises an epoxy-based adhesive. In a preferred embodiment, the seal 740b is dispensed over the raised perimeter 740a. Alternatively, the seal 740b can be screen-printed over the raised perimeter 740a. In yet another embodiment, the seal 740b can be applied using a doctor blade. The skilled artisan will appreciate that the seal 740b is preferably as thin as possible and preferably has a thickness in a range of about 2-200 microns. The skilled artisan will readily appreciate that the seal 740b may be used either solely for the purpose of adhering the raised perimeter 740a to the transparent substrate 710a or for the purpose of not only adhering but also providing additional thickness to the raised perimeter 740a. It will be understood that if the seal 740a is also used to provide additional thickness to the raised perimeter 740a, the thickness ranges provided above for the raised perimeter 740a may be smaller because the combined thickness of the raised perimeter 740a and the seal 740b create the recessed cavity 770. The combined thickness of the raised perimeter 740a and the seal 740b may be at least about 20 microns for a package structure 700 that does not include a desiccant, and more preferably in a range of about 20-60 microns. In certain embodiments in which the package structure 700 includes a desiccant, the combined thickness of the raised perimeter 740a and the seal 740b is preferably at least about 40 microns, and more preferably in a range of about 40-60 microns.

Once the backplate 720 and transparent substrate 710 are joined together, the seal 740b may be cured and hardened, for example, by application of heat or by ultraviolet (UV) curing. The skilled artisan will readily appreciate that a thin seal 740b not only provides a thinner device 700, but also less outgassing when the seal 740b is cured. As with the raised perimeter 740a, as discussed above, outgassing from the seal 740b due to curing could potentially damage the interferometric modulator 730. Minimizing the thickness of the seal 740b minimizes the outgassing potential, and therefore also minimizes any potential damage to the interferometric modulator 730 caused by outgassing from the seal 740b.

The skilled artisan will appreciate that the seal 740b between the backplate 720 and the transparent substrate 710 is different from seals that may be applied after division of the package structure 700 into individual arrays. It is generally desirable to manufacture several arrays of interferometric modulators on a single transparent substrate, apply the backplate, and then divide the structure into individual arrays. Once the seal is hardened, the structure may be mechanically or laser scribed or otherwise prepared for division.

It will be understood that, in an alternative embodiment, the raised perimeter can also function as a seal that adheres the backplate 720 to the transparent substrate 710. Thus, the skilled artisan will readily appreciate that a separate seal 740b is not necessary in this embodiment. According to this embodiment, the raised perimeter comprises a viscous adhesive, such as, for example, an epoxy-based adhesive. The skilled artisan will appreciate that the raised perimeter in this embodiment cannot be prepared well in advance of joining the backplate 720 to the transparent substrate 710.

In an embodiment, the raised perimeter 740a and the seal 740b, together with the backplate 720 and transparent substrate 710, act as an environmental barrier that protects the interferometric modulator 730, preventing substantially all air and water vapor from entering the device 700. In this embodiment, suitable materials for the raised perimeter 740a include, but are not limited to, highly viscous, epoxy-based adhesives. The skilled artisan will readily appreciate that the adhesive component alone may not act as a sufficient environmental barrier because it will eventually allow moisture and other contaminants to permeate into the device 700. Thus, to make the raised perimeter 740a more water impermeable, glass spacer beads may be dispersed in the raised perimeter 740a to act as barriers to block moisture.

Alternatively, to make the raised perimeter 740a more contaminant impermeable, the adhesive material of the raised perimeter 740*a* may be mixed with other getter materials, including, but are not limited to, calcium dioxide, strontium oxide (SRO), silica gels, montmorillonite clay (preferably a magnesium aluminum silicate), molecular sieves (zeolites such as $Na_{12}AlO_3SiO_{212}XH_2O$), and calcium sulfates. In one embodiment, in which the raised perimeter 740*a* is mixed with zeolites to act as contaminant barriers, the zeolites may include aluminosilicate-structured minerals, such as sodium aluminosilicate. In another embodiment, the zeolites may include microporous silicate-structured minerals. It will be appreciated that active components, other than zeolites, that can act as absorbing filters on the molecular level can also be used. Zeolites may absorb water molecules at relatively high temperatures, and can trap moisture and contaminant gases in their pores. The skilled artisan will understand that zeolites having different pore sizes can be selected for the first layer 740*a* material to absorb different types of contaminants. In an embodiment, zeolites are selected to absorb contaminant molecules, such as aromatic branched-chain hydrocarbons that have critical diameters of up to ten angstroms. In another embodiment, zeolites having pore sizes between two and three angstroms may be selected to abort contaminant molecules having diameters of less than two angstroms, such as hydrogen and moisture molecules. In still another embodiment, zeolites having pore sizes of about fifty angstroms (50 Å) can be used to absorb nitrogen and carbon dioxide molecules. The skilled artisan will appreciate that the raised perimeter 740*a* may be comprised of a mixture of zeolites having various pore sizes.

The skilled artisan will understand that the amount or volume of material for the raised perimeter 740*a* and the seal 740*b* will depend on the estimated amount of moisture or contaminant gases that will need to be removed from within the device 700 during the lifetime of the device 700. The volume of material for the raised perimeter 740*a* and the seal 740*b* also depends not only on the amount of moisture or contaminant gases inside the package structure 700 when the package is formed, but also the permeation rate of the seal 700 and the outgassing potential of the package components.

Figure 11:
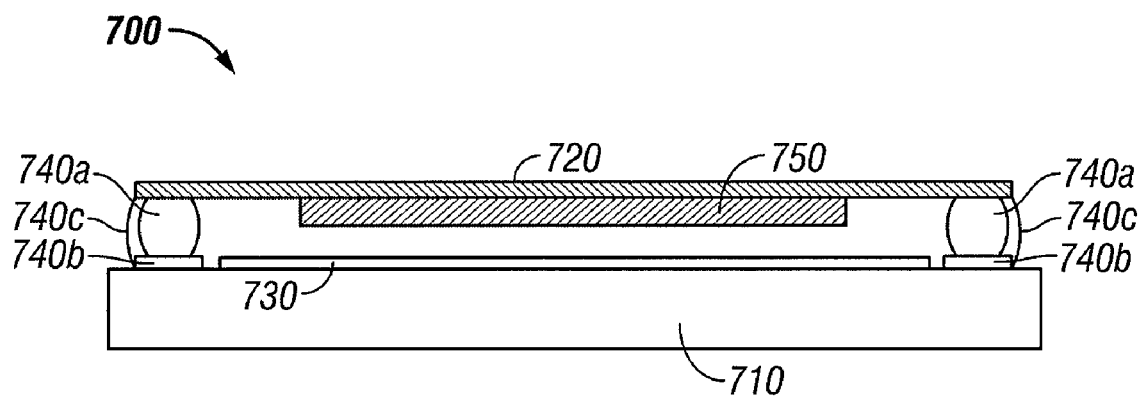
FIG. 11 is a cross-section of another embodiment of a package structure in which an outer bead of adhesive is applied around the outer perimeter of the raised perimeter and the seal.

FIG. 11 is a cross-section of another embodiment of a package structure 700 in which an outer bead of adhesive 740*c* is applied around the outer perimeter of the raised perimeter 740*a* and the seal 740*b*. The outer bead 740*c* may include a low permeation rate adhesive, which can provide additional environmental protection to the package structure 700. The outer bead of adhesive 740*c* may be useful in an environment having a great deal of contaminants where the raised perimeter 740*a* and the seal 740*b* cannot serve as effective barriers. It will be understood that, in these embodiments, the seal 740*b* may not be necessary because the outer bead of adhesive 740*c* acts as an adhesive to bind the transparent substrate 710 to the backplate 720.

As mentioned above, a desiccant may be used to reduce moisture resident within the package structure. Desiccants may be used for packages that have either hermetic or semi-hermetic seals. In a package having a semi-hermetic seal, a desiccant may be used to control moisture moving into the package from the environment. The skilled artisan will appreciate that a desiccant may not be necessary for a hermetically sealed package, but may be desirable to control moisture within the package structure. For packages having hermetic seals, desiccants may be provided within the package to absorb any moisture that moves into the package during the manufacturing process.

In one embodiment, a desiccant 750 is included in the package structure 700. It will be understood that, although the desiccant 750 is applied to recessed cell 780 of the backplate 720 in the illustrated embodiment shown in FIGS. 8 and 9, the desiccant may be applied in other manners within the package 700. For example, the desiccant can be applied to the perimeter of the transparent substrate 710 around the interferometric modulator 730. In an embodiment, the desiccant 750 is applied to the backplate 720 after the recessed area or cell 780 is formed by the raised perimeter 740*a*.

Generally, any substance that can trap moisture while not interfering with the optical properties of the interferometric modulator 730 may be used as the desiccant. Suitable desiccant materials include, but are not limited to, zeolites, molecular sieves, surface adsorbents, bulk adsorbents, and chemical reactants. The skilled artisan will appreciate that the desiccant material should be selected based on a variety of factors, including the estimated amount of contaminant gases in the environment as well as the absorption rate and amount of the desiccant material.

The desiccant may be in different forms, shapes, and sizes. In addition to being in solid form, the desiccant may alternatively be in powder form. These powders may be inserted directly into the package or they may be mixed with an adhesive for application. In an alternative embodiment, the desiccant may be formed into different shapes, such as cylinders or sheets, before being applied inside the package.

In another embodiment, a covered desiccant is deposited within an outer shell. The outer shell protects the desiccant so that it is not activated too early in the manufacturing process. As is known, desiccants are very sensitive to moisture in the environment. If the desiccant is stored, or exposed, in the ambient environment for too long, the desiccant will begin to absorb moisture from the air and thereby be less effective once it is finally deposited within the MEMS device. Accordingly, there are advantages in keeping the desiccant away from the ambient environment until it is required in order to manufacture the MEMS device. Because MEMS devices, and particularly interferometric modulators, can be manufactured in ambient conditions, desiccants that are protected during such manufacturing may be more desirable.

Embodiments of the outer shell include a thin metal layer, liquid crystal polymer such as LCP, plastic, or pressure sensitive adhesives (PSAs). As is known, PSAs are usually tacky or thermal cured to promote adhesion. They can be used as an effective water barrier or placed around the covered desiccant in place of a dispensed or printed adhesive in order to attach the covered desiccant to the backplate and array. The outer shell can also include silica or a glass or similar material. As described below, the outer shell can be made of hollow metal, a metal with one side open, a metal that is weakened side on one side, rubber, PIB, or other like material. In order to manufacture the device 700, the covered desiccant can be laid on the transparent substrate 710 by an automated or manual process. Of course, it should be realized that the outer shell can extend around the entire perimeter of the device or alternatively, leave an opening to be closed later as in an endseal process. Similarly, the raised perimeter 740*a* and the seal 740*b*, as well as an outer bead of adhesive (if any) could also be applied and left with an opening to be closed later in an endseal process. In one embodiment, the desiccant cover has one side open to expose the desiccant inside. Additionally, in one embodiment the outer shell has a weakened side that is opened at assembly thereby allowing the usage of a fast acting desiccant to be incorporated inside the device 700, yet not exposed to ambient conditions until after the assembly process has been completed.

Figure 12:
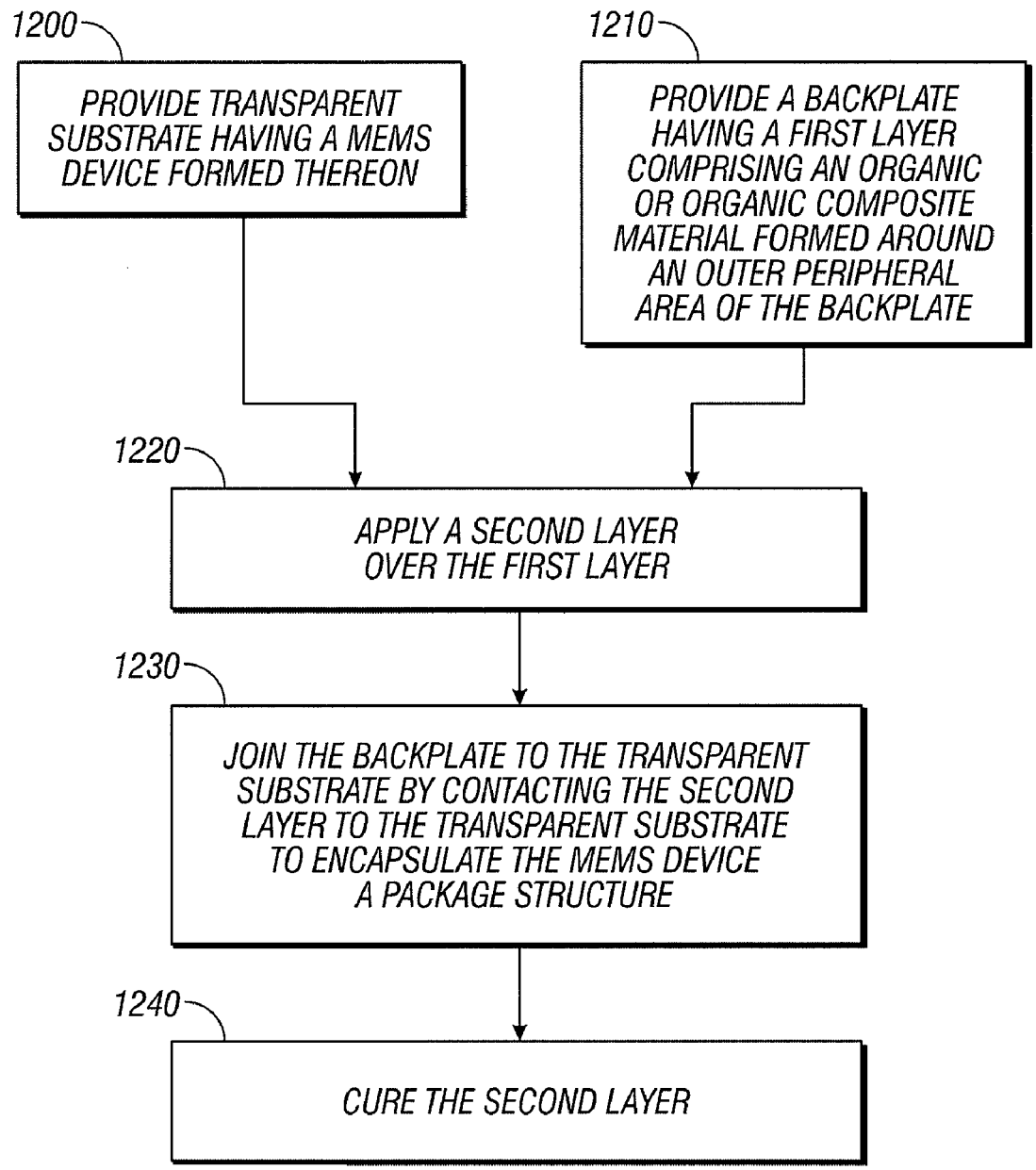
FIG. 12 is a flow diagram of a process for forming a package structure, according to an embodiment.

FIG. 12 is a flow diagram of a process for forming a package structure, according to an embodiment. In step 1200, a transparent substrate having a MEMS device formed thereon is provided. In step 1210, a backplate having a first layer comprising an organic or organic composite material formed around an outer peripheral area of the backplate is provided. Steps 1200 and 1210 may be performed in any order or simultaneously. Thus, steps 1200 and 1210 may be performed well in advance of the remainder of the packaging process. In step 1220, an adhesive second layer is applied over the first layer. The backplate is joined to the transparent substrate by contacting the second layer to the transparent substrate to form a package in which the MEMS device is encapsulated, as shown in step 1230. In step 1240, the second layer is cured.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of manufacturing a display device, comprising:
   providing a transparent substrate having a microelectromechanical systems device formed thereon;
   providing a substantially planar backplate;
   applying a first layer around an outer peripheral area of the backplate to form a raised perimeter structure on the backplate;
   applying an adhesive second layer over the first layer; and
   joining the backplate to the transparent substrate by contacting the second layer to the transparent substrate to form a package after applying the adhesive second layer, wherein the microelectromechanical systems device is encapsulated by the package.

2. The method of claim 1, wherein the second layer is thinner than the first layer.

3. The method of claim 1, wherein the first layer comprises an organic or organic composite material.

4. The method of claim 3, wherein the organic or organic composite material is a viscous material.

5. The method of claim 3, wherein the organic or organic composite material is an epoxy-based adhesive.

6. The method of claim 3, wherein the organic or organic composite material comprises glass binding material selected from the group consisting of epoxy, polyurethane, polysulfide, silicone, vinyl acetate, cellulose vinyl, and neoprene.

7. The method of claim 1, wherein the first layer is dispensed along the outer peripheral area of the backplate.

8. The method of claim 1, wherein the first layer is screen printed along the outer peripheral area of the backplate.

9. The method of claim 1, wherein the first layer is formed by depositing a layer of photosensitive material over the backplate and patterning the layer of photosensitive material.

10. The method of claim 9, wherein the layer of photosensitive material is deposited by roller coating.

11. The method of claim 9, wherein the layer of photosensitive material is deposited by spin coating.

12. The method of claim 1, further comprising curing the first layer before applying the second layer.

13. The method of claim 1, wherein a combined thickness of the first layer and the second layer is in the range of about 20-60 microns.

14. The method of claim 1, further comprising applying a desiccant to the backplate before joining the backplate to the transparent substrate.

15. The method of claim 1, wherein the microelectromechanical systems device is an interferometric modulator.

16. A method of manufacturing a display device, comprising:
    providing a substrate, the substrate supporting an array of interferometric modulators;
    providing a backplate;
    forming a raised perimeter structure on the backplate;
    applying an adhesive layer over the raised perimeter structure after forming the raised perimeter structure on the backplate; and
    sealing the backplate to the transparent substrate via the adhesive layer to form a package, wherein the array of interferometric modulators is encapsulated by the package.

17. The method of claim 16, wherein the raised perimeter structure comprises an organic or organic composite material.

18. The method of claim 17, wherein the organic or organic composite material is a viscous material.

19. The method of claim 17, wherein the organic or organic composite material is an epoxy-based adhesive.

20. The method of claim 17, wherein the organic or organic composite material comprises glass binding material selected from the group consisting of epoxy, polyurethane, polysulfide, silicone, vinyl acetate, cellulose vinyl, and neoprene.

21. The method of claim 16, further comprising curing the raised perimeter structure before applying the adhesive layer.

22. The method of claim 16, wherein a combined thickness of the first layer and the second layer is in the range of about 20-60 microns.

23. The method of claim 16, further comprising applying a desiccant to the backplate before joining the backplate to the transparent substrate.

* * * * *